United States Patent [19]

Wilmanns

[11] 4,140,078
[45] Feb. 20, 1979

[54] METHOD AND APPARATUS FOR REGULATING EVAPORATING RATE AND LAYER BUILD UP IN THE PRODUCTION OF THIN LAYERS

[75] Inventor: Ingo G. Wilmanns, Gelsdorf, Fed. Rep. of Germany

[73] Assignee: Leybold Heraeus GmbH & Co. KG, Cologne, Fed. Rep. of Germany

[21] Appl. No.: 740,605

[22] Filed: Nov. 10, 1976

Related U.S. Application Data

[62] Division of Ser. No. 557,283, Mar. 11, 1975, Pat. No. 4,068,016.

[30] Foreign Application Priority Data

Mar. 16, 1974 [DE] Fed. Rep. of Germany ....... 2412729

[51] Int. Cl.² .......................................... C23C 13/04
[52] U.S. Cl. ......................................... 118/8; 118/49.1
[58] Field of Search ............................. 118/7, 8, 49.1

[56] References Cited

U.S. PATENT DOCUMENTS

| | | | |
|---|---|---|---|
| 3,071,533 | 1/1963 | Blankenship | 118/7 X |
| 3,734,620 | 5/1973 | Cade | 118/7 X |
| 3,800,738 | 4/1974 | Tassara | 118/8 |
| 3,853,093 | 12/1974 | Baker et al. | 118/8 |
| 4,024,291 | 5/1977 | Wilmans | 118/8 X |

*Primary Examiner*—Wm. Carter Reynolds
*Attorney, Agent, or Firm*—Max Fogiel

[57] ABSTRACT

An arrangement for regulating the evaporation rate and the layer buildup in the production of optically effective thin layers in a vacuum on substrates with controlled evaporator power and with continuous measuring of the optical characteristics of the deposited layer. The evaporation is started with a given evaporator power and with the start of change of the optical characteristics of the layer, the measured result after forming the time derivative is continuously compared with the output signal of a signal generator. This output signal reproduces the time rate of change of the optical properties during the layer buildup. The difference signal of the comparison signal is used to increase the evaporator power if the layer buildup lags, and to reduce this power if the layer buildup is too fast.

6 Claims, 1 Drawing Figure

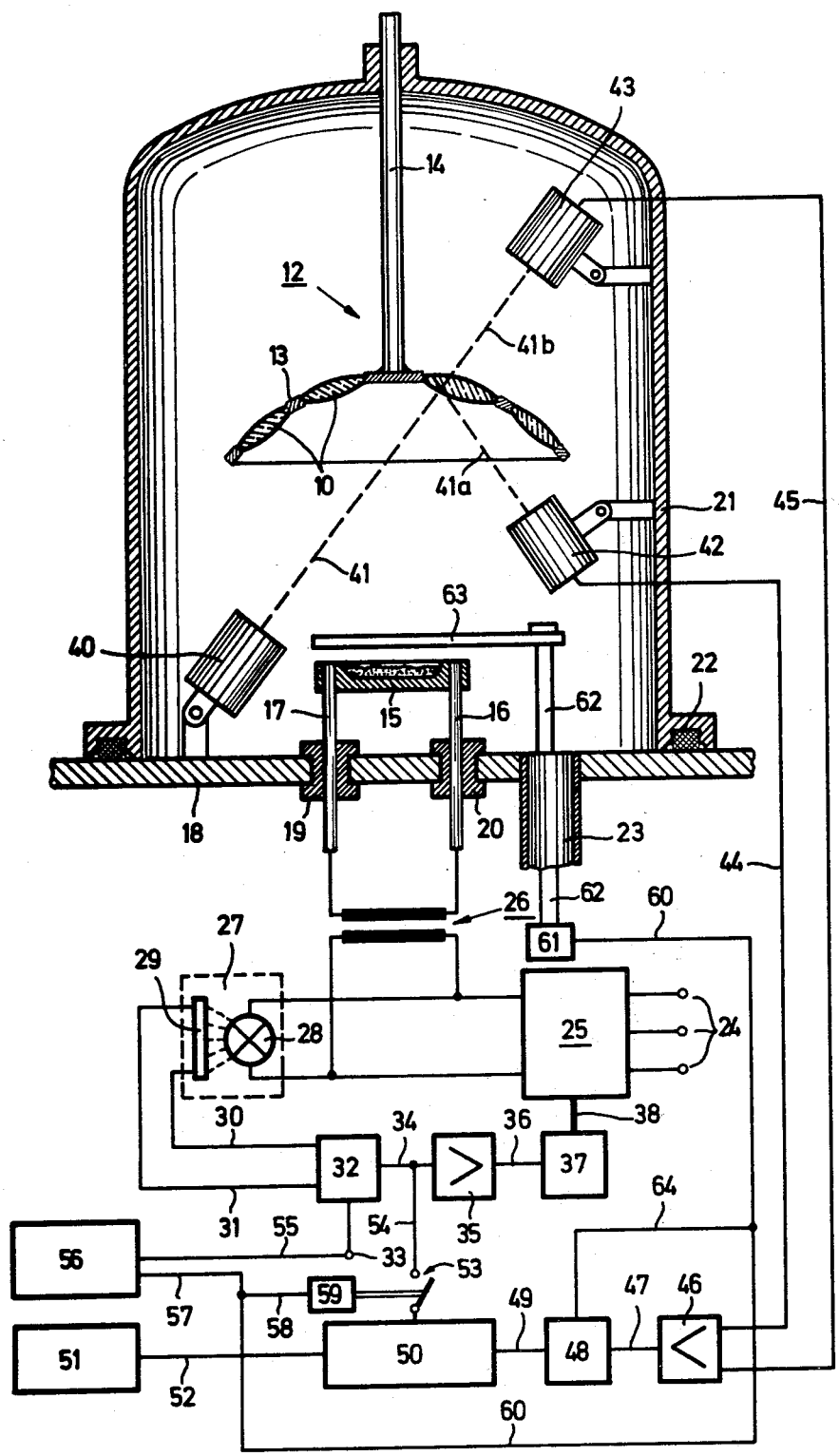

METHOD AND APPARATUS FOR REGULATING EVAPORATING RATE AND LAYER BUILD UP IN THE PRODUCTION OF THIN LAYERS

This is a division, of application Ser. No. 557,283 filed Mar. 11, 1975 now U.S. Pat. No. 4,068,016.

BACKGROUND OF THE INVENTION

The present invention concerns a procedure for regulating the evaporation rate and the layer buildup in the production of optically effective thin layers in a vacuum on substrates with controlled evaporator power and with continuous measurement of the optical behavior of the deposited layer.

In the description of this invention, "optical behavior" means the influence on the amplitude, phase and the spectral dependence of the light (used for measurement) by the layer under consideration. Deposited, optically effective layers change, for example, transmission, reflection, phase and state of polarization of the measuring light. These effects can be used for measuring purposes as described below.

It is known in the art how to influence the evaporation rate of substances required in the production of thin layers by controlling the energy supply. It is also known in the art how to determine the transmission or reflection behavior of the deposited layer by means of a light beam or a light bundle, for German Pat. DT-AS No. 1 548 262. The result of such measurement is usually used to interrupt the evaporation process after attaining certain layer properties. The evaporation time determining the properties of the deposited layer is not influenced thereby. Finally it is also known to follow layer buildup as a function of time and to interrupt the evaporation process by continuously monitoring the transmission or reflection behavior of monochromatic light and counting the maximums or minimums. The number of maximums or minimums, dependent on the wavelength of the light used, permits an inference as to the thickness of the layer (German Pat. DT-AS No. 1 214 970). Also with this known measuring method, only the layer thickness, but not the duration of their production is involved.

In this application, the term "optically effective layers" will include all layers which change the optical properties of the substrate. They may be reflection-reducing layers, filter layers on lenses and other glasses which reflect or transmit, part of the electromagnetic radiation in the visible and/or invisible range. The wavelength range under consideration in this application extends from ultraviolet to the far infrared. The optical effectiveness relates, above all, to low-loss amplitude changes of the reflected or transmitted radiation. It also includes layers which change the phase or the polarization state of the light used for the measurement.

Optically effective layers may have both a homogeneous or (in an individual layer) nonhomogeneous composition or may consist of a combination of a number of layers with low and high refractivity, as are encountered, for example, with the so-called interference filters which have the remarkable property of compensating to a great extent errors in the thickness of individual layers, if the individual layers have the optical thickness of quarter-wavelengths of the light used for measurement or multiples thereof. This presupposes, however, that the subsequent layer grows together with the preceding layers till the desired properties are reached. Hence, not the properties of the individual layer, but the effect of the totality of the layers determine the effect attained. From this follows, that especially multiple layers of the stated type may be manufactured only by using optical measuring procedures, but not by using mechanical measuring procedures, in order to obtain the desired close tolerances. For example, weighing methods cannot determine the partial or total optical effect. When using a quartz resonator for determining layer thickness, the type and the partial pressure of the unavoidable gas remainder in the vacuum chamber play an appreciable part in view of the accuracy of the measurement result.

In view of the overall properties of optically effective thin layers, recently progressively closer tolerances have been demanded. This presupposes that the manufacturing method for the layers is, to a high degree, reproducible in order to obtain always layers with the same constant characteristics. This does not only apply to the numerous surface layers of complex optical systems, but especially for eyeglasses, in particular sunglasses. It is self-understood that, for example, in case of eyeglass breakage, replacement by a glass with different optical properties is not permissible. Color differences are particularly intolerable.

Accordingly, it is an object of the present invention to provide a procedure for obtaining high reproducibility of all properties of optically effective layers during their manufacture with extremely simple operation of the evaporator device.

Another object of the present invention is to provide an arrangement of the foregoing character which may be economically fabricated and has a substantially long operating life.

A further object of the present invention is to provide an arrangement, as described, in which the component parts are readily accessible for maintaining them in service.

SUMMARY OF THE INVENTION

The objects of the present invention are achieved by providing that the evaporation is started at a given evaporator power. Starting with the change of the optical behavior of the layer, the resulting measured result, after forming the time derivative, is continuously compared with the output signal of a signal generator which reproduces the temporal course (rate of change) of the optical properties during layer buildup under optimum conditions. The difference signal of the comparison is used to increase the evaporator power if the layer buildup lags, and to reduce it if the layer buildup is too fast.

The invention is based on the following principle. To obtain a uniform quality of the layers, it absolutely is necessary to complete the evaporation process for each individual layer in a fixed period of time. For a certain spatial arrangement of evaporator and substrate, this fixed period results in optimum uniformity of the thickness distribution in the substrates which, in most cases, are arranged in many ways. The invention is based on the principle of evaporation with constant evaporation rate or constant power input to the evaporation device. In principle, it consists in a correction of the evaporator power (whose order of magnitude is given) by a time-dependent control of the layer buildup, i.e., of the process of creating the layer. If the layer buildup is delayed with respect to the given time program, the evaporator power is increased by the proper amount. However, if the layer buildup proceeds too rapidly, the evaporator power is reduced by a suitable amount.

The procedure of the subject invention has the advantage that all layers of different charges are built up under precisely the same reproducible conditions as previous charges. Deviations with respect to the optical and mechanical properties are reduced to a minimum. Among the mechanical properties are the adhesive strength, mar resistance and freedom from pores as well as the resistance to chemical, in particular atmospheric influences. Also, the uniformity of layers on substrates of the same charge with a different spatial position relative to the evaporator source is increased considerably. In addition, the influence of different heat transfers from the evaporator to the material to be evaporated, is compensated by the regulation. With strict regulation for constant electric power on the evaporator, for instance, a change in heat transfer from the evaporator to the material to be evaporated would lead to a change in the evaporation rate. In this connection, there is a change in heat transfer due to different granulated material size of the evaporated material and possible influences of chemical reactions between evaporator and evaporation material. Above all, the regulation procedure of the present invention makes possible operation of such an evaporation device by personnel without scientific background, without increasing the rate of rejects.

Continuous measurement of the reflection and transmission behavior of the layer, especially with the use of monochromatic light, leads to measured values which have a time-dependent behavior in such a way that, for example, the reflection of the layer up to the thickness of a quarter wavelength of the light used in the measurement decreases, and then increases up to a layer thickness of half a wavelength to the initial value. It then decreases up to a layer thickness of three-quarter wavelength and so forth. Such a curve has been described in German Pat. DT-AS No. 1 214 970 in detail. However, direct use of the measurement result which has a temporal cosine curve for the transmission and reflection properties as a function of the layer thickness growth, runs into difficulties. The reason is that the curve in question has very flat maximums and minimums which does not permit exact timewise limitation of the evaporation process in the maximums and minimums. However, by forming the time derivative the following is achieved. The curve in question at the maximums and minimums has a zero crossing which is convenient for shutoff and regulating purposes. The zero crossing can be used for the precise termination of the evaporation process of each individual layer.

The design in accordance with the present invention of the signal generator used for generating the nominal (reference) value is made with the suitable selection of electrical and/or mechanical elements. The curve shape of the output signal is determined on the basis of the above-described theoretical considerations: transmission and reflection change with a growing layer according to a sine function and the time derivative changes according to a cosine function. For example, the time dependent course of the curve can be found empirically, by statistical investigations and analyses during and/or after the manufacture of optically effective layers. With respect to order of magnitude, one requires for the passage (crossing) of a half-wave, i.e., the buildup of a layer thickness of half-wavelength of the light used, a time of several minutes. The time rate of change of the optical properties is identical with the time derivative of the measurement result of the layer under optimum conditions. Consequently, with complete agreement of the time curves of measurement result and output signal of the signal generator, it is not necessary to interfere with the power regulation of the evaporator. By using the derivative of the pure measured value one has the special advantage that the regulation becomes independent of timewise fluctuations of the origin and of deviations of the scale value of an indicating instrument.

An arrangement for carrying out the regulating procedure of the present invention consists of an evaporator inside a vacuum chamber and an associated substrate holder, a device for regulating the evaporator power with a measuring device for the evaporator power, and a feedback of the measured value to a correcting element for the evaporator power. In addition, there is provided a device for continuous measurement and differentiating the optical behavior of the layer during the buildup. The output of the signal generator, together with the differentiated output of the measuring device for the optical behavior, which determines the timewise course of the change of optical properties during layer buildup under optimum conditions, are connected to a comparator device. The output of the former, together with the output of the measuring device for the evaporator power, is connected to the correcting element for the evaporator power.

In accordance with the present invention, furthermore, the output of a signal generator for a power program is connected to the output of the measuring device for the evaporator power. Such a power program is also obtained empirically. The power program takes into consideration the preheating and melting of the evaporation material in the evaporator.

It is advantageous to use as measuring device for the evaporator power, a device for converting electric power into electromagnetic radiation in connection with a radiation receiver tuned thereto. In principle, such an arrangement is an amplifier of simple design with high gain, long lifetime and hence high operational safety. The electromagnetic radiator, represented most simply by an incandescent lamp, has the advantage of responding immediately to a change in current or voltage and of emitting a suitable changed light flux which is communicated immediately to the radiation receiver tuned thereto.

The present invention provides further a signal generator for the power program, which is designed in such a way that after termination of the melting process, a switching pulse is generated which is applied to a circuit element for adding the comparison (reference) value from the reflection or transmission measurement and from the signal generator. The pulse is also applied to an aperture drive for releasing the evaporator by an aperture (diaphragm). This results in a fully automatic start of the evaporation process. The end of the melting process is determined empirically, i.e., by simple observation. The resulting time interval holds, if necessary with a safety margin, for all further melting processes of the same evaporation material. By simultaneous starting of the signal generator with the desired sine-shaped output voltage in accordance with the time-dependent nominal value curve, there is made possible a nominal-actual value comparison of the deposited layer. This results in the stated correction of the pre-set power value for the evaporator during the entire evaporation process. Termination of the evaporation process is accomplished by determining the zero crossing of the time derivative of the measured result, by means of a thus triggered control signal which again closes the aperture, i.e., rotates the diaphragm over the evaporator.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

A schematic sectional view showing the components of the present invention and their interrelationships.

DESCRIPTION OF THE PREFERRED EMBODIMENTS

Referring to the drawing, there are provided substrates 10 or optical lenses on which the layer to be vaporized is precipitated. By means of claws (not shown), the substrates are mounted in a holding device 12 consisting of a spherical dish 13 with suitable cutouts and a rod 14 whose position is adjustable. Below substrate 10 is a so-called thermic evaporator 15 for evaporating the evaporation material. The evaporator rests on two studs 16 and 17 which also are used for supplying current and pass via vacuum gaskets (bushings) 19 and 20 through a base plate 18. The parts mentioned are enclosed by a vacuum-tight bell-shaped cover 21 which rests on base plate 18 with a circumferential seal or gasket 22 in between. A vacuum of $2 \times 10^{-5}$ torr, for example, sufficient for the evaporation process, is produced by a pump which is connected via a pipeline 23 to the base plate 18.

The heating current for the evaporator 15 is furnished by a power source which is connected via terminals 24 to a power regulating unit 25 in the form of a variable-ratio transformer. To the variable-ratio transformer, there is connected a transformer 26. This transformer converts the heater voltage to a value which, with the given electric conductivity of the evaporator 15, produces the required heating power.

Parallel to transformer 26, or to the evaporator 15, there is connected a measuring device 27 for the evaporator power. This measuring device consists of a device 28 for converting electric power into electromagnetic radiation, and a radiation receiver 29 that is properly adjusted. Visual connection exists between devices 28 and 29 so that at least part of the radiation emitted by device 28 arrives at radiation receiver or pickup 29. Radiation receiver 29 is connected via lines 30 and 31 with an input control 32 to whose input terminal 33 a variable nominal value can be applied. In the input control 32, a comparison is made with the nominal voltage supplied via lines 30 and 31. The output of the input control 32 is connected via a line 34 with an amplifier 35 whose output is connected via a line 36 to a correcting element 37. In the case at hand, the correcting element 37 is a servomotor which is coupled via an adjusting shaft 38 to the adjusting device of the variable-ratio transformer 25.

The mode of operation of the above arrangement is as follows. If, for example, there is at terminals 24 a voltage which leads to an excessive mean heating power of evaporator 15, the electromagnetic radiation power emitted by device 28 is necessarily increased. That part of the radiation incident on the radiation receiver 29 produces a corresponding actual value. Via the previously stated circuit elements, this leads to a downward adjustment of the variable-ratio transformer 25 so that the heating power at the evaporator 15 is reduced to the set value. In case of insufficient voltage at terminals 24 and the resulting insufficient mean power of evaporator 15, the reverse action takes place. Because of the high amplification ratio (gain) of the measuring device 27, the evaporator power is regulated extremely rapidly with minimum deviations from the desired value so that the power in the evaporator is kept at a practically constant value.

Inside the bell-shaped cover 21, in addition to the already mentioned parts, there is a light source 40 (surrounded by a cover) which emits a bunched light beam 41. The light beam strikes one of substrates 10, and is there resolved into a reflected component 41a and a transmitted component 41b. The reflected component 41a is delivered to a photo receiver 42, and the transmitted component 41b is delivered to a photo receiver 43. It is possible to use either the measured value of one or the other photo receiver for the evaluation, or the combined output signals of both photo receivers jointly, e.g., for obtaining the difference in order to determine the absorption. The outputs of photo receivers 42, and 43 are connected respectively, via lines 44 and 45 to an amplifier 46, and then via line 47 to a differential element 48 in which the derivative of the measured values is formed. The output of the differential element 48 is connected via line 49 to a comparison device 50. The output of a signal generator 51, which provides the temporal course of the change of optical properties during layer buildup under optimum conditions, is connected via line 52 to comparison device 50. In this comparison device, the nominal value coming from signal generator 51 is compared with the actual values coming from photo receivers 42 or 43. The difference signal formed as a result of the comparison is connected via circuit element 53 and line 54 to line 34. As a result, the difference signal, together with the output of the measuring device 27 or of the input control 32, is connected via amplifier 35 to the correcting element 37 for the evaporator power. The signal generator 51 may provide a sine-shaped signal reproducing the time rate of change of the optical characteristics of the layer during buildup under predetermined optimum conditions, and is independent from the optical characteristics of the layer being deposited.

Input terminal 33 is connected via line 55 to an additional signal generator 56 which provides a power program for the evaporator 15. However, to input terminal there may also be applied a nominal value adjustable by means of a potentiometer. The nominal value or program applied to the input terminal 33 is not affected by external influences. Signal generator 56 has an additional output. There, on the basis of the given program, after the melting process is over, a switching pulse is generated which is connected via line 57 or 58, to an actuator 59 for the circuit element 53. The same output is connected via line 57 and a connection line 60 to an aperture drive 61 which, by means of an actuating shaft 62, drives a disk-like aperture or diaphragm 63 by means of which the evaporator 15 can be covered completely. During the generation of the switching pulse in signal generator 56, circuit element 53 is closed and diaphragm or aperture 63 is opened so that the actual evaporation process may start.

The mode of operation of the overall arrangement is as follows. After loading the evaporator 15 and the substrate holder 12, and after evacuation of the bell-shaped cover 21, circuit element 53 is, at first, still open. On the basis of the fixed power program provided by signal generator 56, the power of evaporator 15 is regulated to this value. The input is made in such a way that a preheating and melting of the evaporation material is definitely brought about. As soon as the switching pulse is generated in the signal generator 56, actuator 59 closes control or switching element 53 and opens aperture 63 so that the evaporation process starts. At the same time, pulse generator 51 is started.

As long as the time derivative of the measuring result of the photo receiver 42 or 43, at the output of the differential element 48 does not deviate from the output of signal generator 51, there is formed in the comparison element the output signal "O" which, of course, does not affect the feedback signal of the measuring device 27. But, if deviations from the given nominal values are recorded in photo receivers 42 or 43, the comparison or reference device 50 forms a difference signal which influences the feedback signal of the measuring device 27 to the correcting element 37. If one of the two photo receivers 42 or 43, records too rapid a layer growth, the feedback signal of the measuring device 27 is affected in such a way that the variable-ratio transformer 25 is reduced to a lower evaporator temperature or evaporation rate. In the opposite case, the variable-ratio transformer 25 is increased so that the temperature of evaporator 15 and hence the evaporation rate increases. The rate of change of the evaporation rate amounts only to a fraction of a period of the measured values so that the system is more than sufficiently free from inertia. Differential element 48 has an additional output which is connected via line 64 to line 60 and hence to the aperture drive 61, in order to stop the evaporation process after reading the desired layer thickness.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention, and therefore, such adaptations should and are intended to be comprehended within the meaning and range of equivalence of the following claims.

I claim:

1. Apparatus for regulating the evaporation rate and layer buildup in the production of optically thin layers comprising, in combination, a vacuum chamber; evaporator means in said vacuum chamber; substrate holding means in said chamber; means for applying electric power to said evaporator means; regulating means for regulating said power applied to said evaporator means; means for measuring continuously the optical characteristics of the layer deposited on said substrate and including amplifier means, and single differentiating means for differentiating the signal corresponding to the optical characteristics of the layer during buildup; signal generator means for providing a sine-shaped signal reproducing the time rate of change of the optical characteristics of the layer during buildup under predetermined optimum conditions and being independent from the optical characteristics of the layer being deposited; comparator means connected to the output of said differentiating means and the output of said signal generator means, the output of said comparator means being connected to said means for regulating said electric power to increase the evaporation rate when layer buildup lags and to reduce the evaporation rate when layer buildup is too rapid.

2. The apparatus as defined in claim 1 wherein said signal generator means generates a switching pulse when evaporation has been completed for releasing said evaporator means.

3. The apparatus as defined in claim 2 including aperture drive means for releasing said evaporator means.

4. The apparatus as defined in claim 3 including diaphragm means actuated by said aperture drive means.

5. Apparatus for regulating the evaporation rate and layer buildup in the production of optically thin layers comprising, in combination, a vacuum chamber; evaporator means in said vacuum chamber; substrate holding means in said chamber; means for applying electric power to said evaporator means; regulating means for regulating said power applied to said evaporator means; means for measuring continuously the optical characteristics of the layer deposited on said substrate and including amplifier means, and means for differentiating the signal corresponding to the optical characteristics of the layer during buildup, signal generator means for providing a sine-shaped signal reproducing the time rate of change of the optical characteristics of the layer during buildup under predetermined optimum conditions and being independent from the optical characteristics of the layer being deposited; comparator means connected to the output of said differentiating means and the output of said signal generator means, the output of said comparator means being connected to said means for regulating said electric power to increase the evaporation rate when layer buildup lags and to reduce the evaporation rate when layer buildup is too rapid; said regulating means for regulating the evaporation rate including a measuring device for measuring the electric power input of the evaporation means, said power regulating means having control means, the output of said measuring device being connected to said control means, the output of said comparator means for comparing the signal produced by the optical characteristics of the layer with the signal produced by the signal generator being additionally connected to the output of said control means.

6. The apparatus as defined in claim 5, wherein said measuring device comprises means for converting electric power into electromagnetic radiation; and radiation receiver means for receiving said electromagnetic radiation.

* * * * *